United States Patent
Beinert et al.

(10) Patent No.: US 11,972,988 B2
(45) Date of Patent: Apr. 30, 2024

(54) SOLAR CELL AND PHOTOVOLTAIC MODULE

(71) Applicant: Fraunhofer-Gesellschaft zur Förderung der angewandten Forschung e.V., Munich (DE)

(72) Inventors: Andreas Beinert, Freiburg (DE); Ulrich Eitner, Freiburg (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 121 days.

(21) Appl. No.: 17/068,927

(22) Filed: Oct. 13, 2020

(65) Prior Publication Data

US 2021/0028076 A1 Jan. 28, 2021

Related U.S. Application Data

(63) Continuation of application No. PCT/EP2019/060184, filed on Apr. 18, 2019.

(30) Foreign Application Priority Data

Apr. 20, 2018 (DE) .......................... 102018206155.6

(51) Int. Cl.
*H01L 21/66* (2006.01)
*G01K 7/16* (2006.01)
(Continued)

(52) U.S. Cl.
CPC ................. *H01L 22/30* (2013.01); *G01K 7/16* (2013.01); *G01L 1/18* (2013.01); *G01L 1/22* (2013.01); *G01N 27/223* (2013.01); *H01L 31/02008* (2013.01); *H01L 31/02168* (2013.01); *H01L 31/022425* (2013.01); *H01L 31/048* (2013.01); *H02S 50/10* (2014.12)

(58) Field of Classification Search
CPC .... G01K 7/16; G01L 1/18; G01L 1/22; G01N 27/223; H01L 31/02008; H01L 31/02168; H01L 31/022425; H01L 31/048
See application file for complete search history.

(56) References Cited

U.S. PATENT DOCUMENTS

| | | | |
|---|---|---|---|
| 2004/0089058 A1 | 5/2004 | De Haan et al. |
| 2010/0037950 A1 | 2/2010 | Wirth |
| | | (Continued) | |

FOREIGN PATENT DOCUMENTS

| | | | |
|---|---|---|---|
| DE | 102008037821 A1 | 2/2010 |
| DE | 102009051759 A1 | 5/2011 |
| | (Continued) | | |

OTHER PUBLICATIONS

Machine English Translation WO 2011160151, accessed Aug. 13, 2022 (Year: 2011).*

(Continued)

*Primary Examiner* — Kourtney R S Carlson
(74) *Attorney, Agent, or Firm* — McClure, Qualey & Rodack, LLP

(57) ABSTRACT

A solar cell includes a layer stack that has at least one substrate, at least one doped region and at least one metallization structure. A sensor is integrated in this layer stack.

18 Claims, 12 Drawing Sheets

(51) Int. Cl.
*G01L 1/18* (2006.01)
*G01L 1/22* (2006.01)
*G01N 27/22* (2006.01)
*H01L 31/02* (2006.01)
*H01L 31/0216* (2014.01)
*H01L 31/0224* (2006.01)
*H01L 31/048* (2014.01)
*H02S 50/10* (2014.01)

(56) References Cited

U.S. PATENT DOCUMENTS

| | | |
|---|---|---|
| 2012/0060902 A1 | 3/2012 | Drake |
| 2014/0026936 A1 | 1/2014 | Thaidigsmann et al. |
| 2015/0000731 A1* | 1/2015 | Boreland ............ H01L 31/0201 438/98 |
| 2015/0303869 A1 | 10/2015 | Nichiporuk et al. |

FOREIGN PATENT DOCUMENTS

| | | | |
|---|---|---|---|
| DE | 102011010077 A1 | 8/2012 | |
| DE | 102011012582 A1 | 8/2012 | |
| DE | 102014200352 A1 | 7/2015 | |
| JP | 200736112 A | 9/2008 | |
| JP | 2012115502 A1 | 6/2012 | |
| WO | 2011160151 A1 | 12/2011 | |
| WO | WO-2012115502 A1 * | 8/2012 | ............ G01K 13/00 |
| WO | 2012116796 A2 | 9/2012 | |

OTHER PUBLICATIONS

J. C. Suhling et al.: "Silicon piezoresistive stress sensors and their application in electronic packaging", IEEE Sensors Journal, Jun. 1, 2001, pp. 14-30, XP011402727, ISSN: 1530-437X, DOI: 10.1109/JSEN.2001.923584.

M. Jankovec et al.: "In-Situ Monitoring of Moisture Ingress in PV Modules Using Digital Humidity Sensors", IEEE Journal of Photovoltaics, vol. 6, No. 5, Sep. 1, 2016, pp. 1152-1159, XP011620763, ISSN: 2156-3381, DOI: 10.1109/JPHOTOV.2016.2583779.

J.-L. Hou et al.: "Self-biased ZnO nanowire humidity sensor vertically integrated on triple junction solar cell"; Sensors and Actuators B, 197, 2014, pp. 137-141, ISSN 0925-4005.

V. A. Handara et al.: "Probing stress and fracture mechanism in encapsulated thin silicon solar cells by synchrotron X-ray microdiffraction," Solar Energy Materials and Solar Cells, vol. 162, pp. 30-40, 2017.

S. K. Tippabhotla et al.: "Synchrotron X-ray Micro-diffraction—Probing Stress State in Encapsulated Thin Silicon Solar Cells," International Conference on Materials for Advanced Technologies (ICMAT2015), Symposium C—Solar PV (Photovoltaics) Materials, Manufacturing and Reliability, vol. 139, pp. 123-133, 2016.

W. Mühleisen et al.: "Stress Measurements in Interconnected Solar Cells with Raman Spectroscopy", in Proceedings of the 31st European Photovoltaic Solar Energy Conference and Exhibition, Hamburg, Germany, 2015, pp. 160-163.

A. Büchler et al.: "Enabling stress determination on alkaline textured silicon using Raman spectroscopy", Energy Procedia, vol. 124, pp. 18-23, 2017.

A. J. Beinert et al.: "Thermomechanical stress analysis of PV module production processes by Raman spectroscopy and FEM simulation", Energy Procedia, vol. 124, pp. 464-469, 2017.

P. Gieschke et al.: "CMOS-based piezo-FET stress sensors in Wheatstone bridge configuration", in 2011 IEEE Sensors, Limerick, Ireland, pp. 93-96.

P. Gieschke et al.: "CMOS-integrated Sensor chip for in-plane and out-of-plane shear stress", Procedia Engineering, vol. 5, pp. 1364-1367, 2010.

Y. Kanda: "Piezoresistance effect of silicon", Sensors and Actuators A, vol. 28, pp. 83-91, 1991.

J. R. Rumble, CRC handbook of chemistry and physics, 98th ed. Boca Raton, Florida: CRC Press, 2017.

Aufbau PV Modul (no English version available).
Datasheet PV Modul (no English version available).
Datasheet Solarzelle (no English version available).
International Search Report, dated Jul. 23, 2019 from PCT/EP2019/060184.
English Translation of International Search Report, dated Jul. 23, 2019 from PCT/EP2019/060184.
Written Opinion, Apr. 18, 2019 from PCT/EP2019/060184.

* cited by examiner

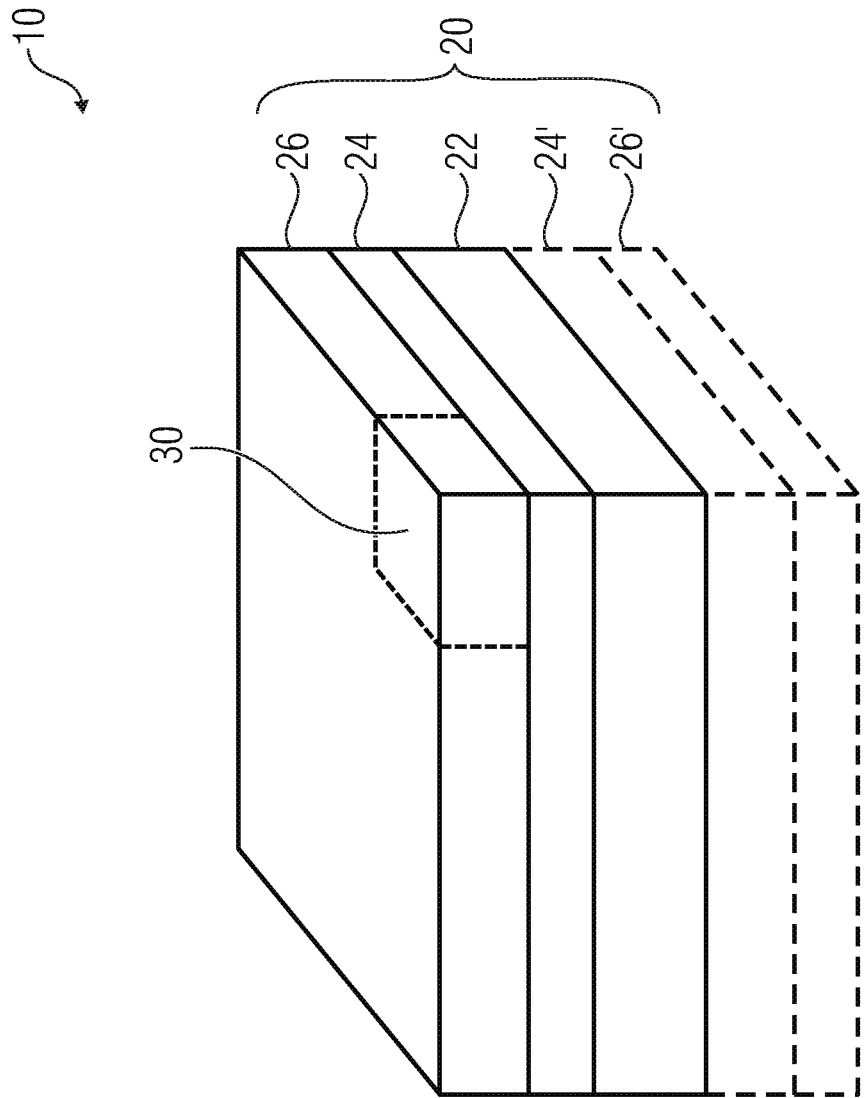

| variant | aspect ratio a [-] | charge carrier concentrations N [cm$^{-3}$] | resistance R$_\sigma$ [Ω] |
|---|---|---|---|
| 1 | 5 | $1 \cdot 10^{19}$ | 500 |
| 2 | 10 | $1 \cdot 10^{19}$ | 1000 |
| 3 | 50 | $1 \cdot 10^{19}$ | 500 |
| 4 | 5 | $5 \cdot 10^{19}$ | 500 |
| 5 | 10 | $5 \cdot 10^{19}$ | 1000 |
| 6 | 50 | $5 \cdot 10^{19}$ | 500 |

Fig. 2b

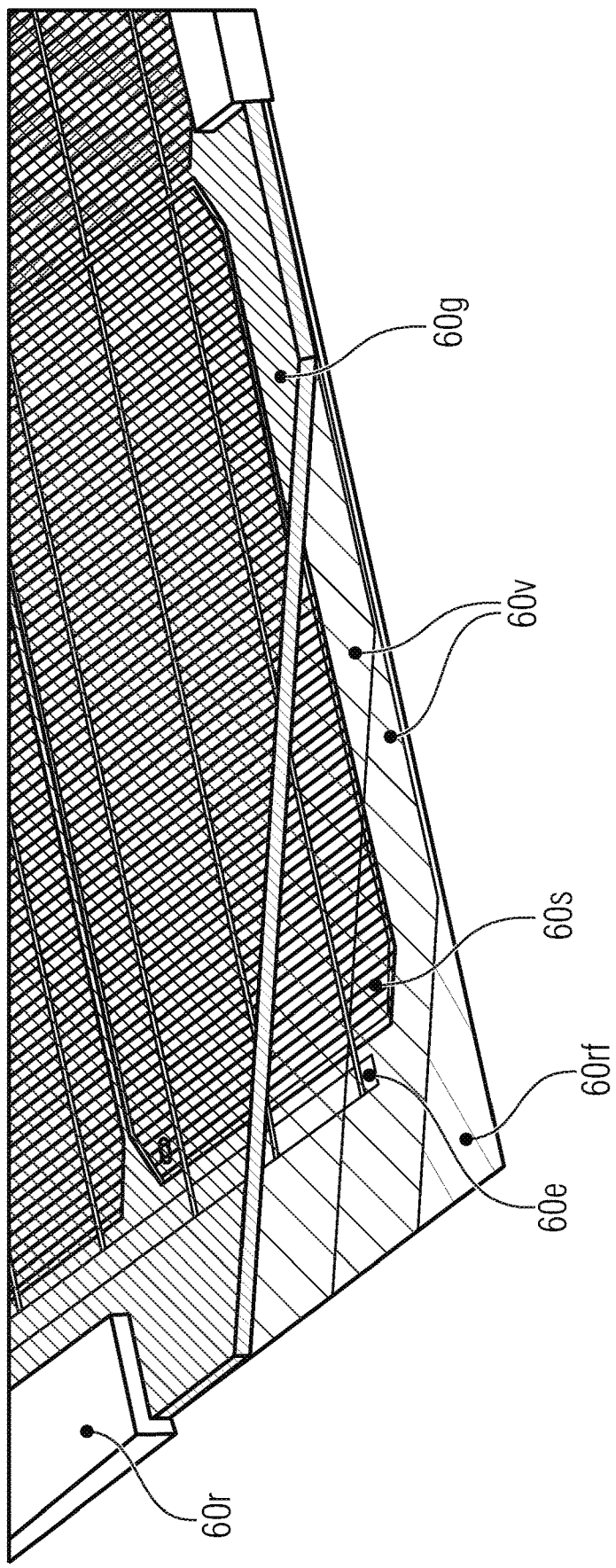

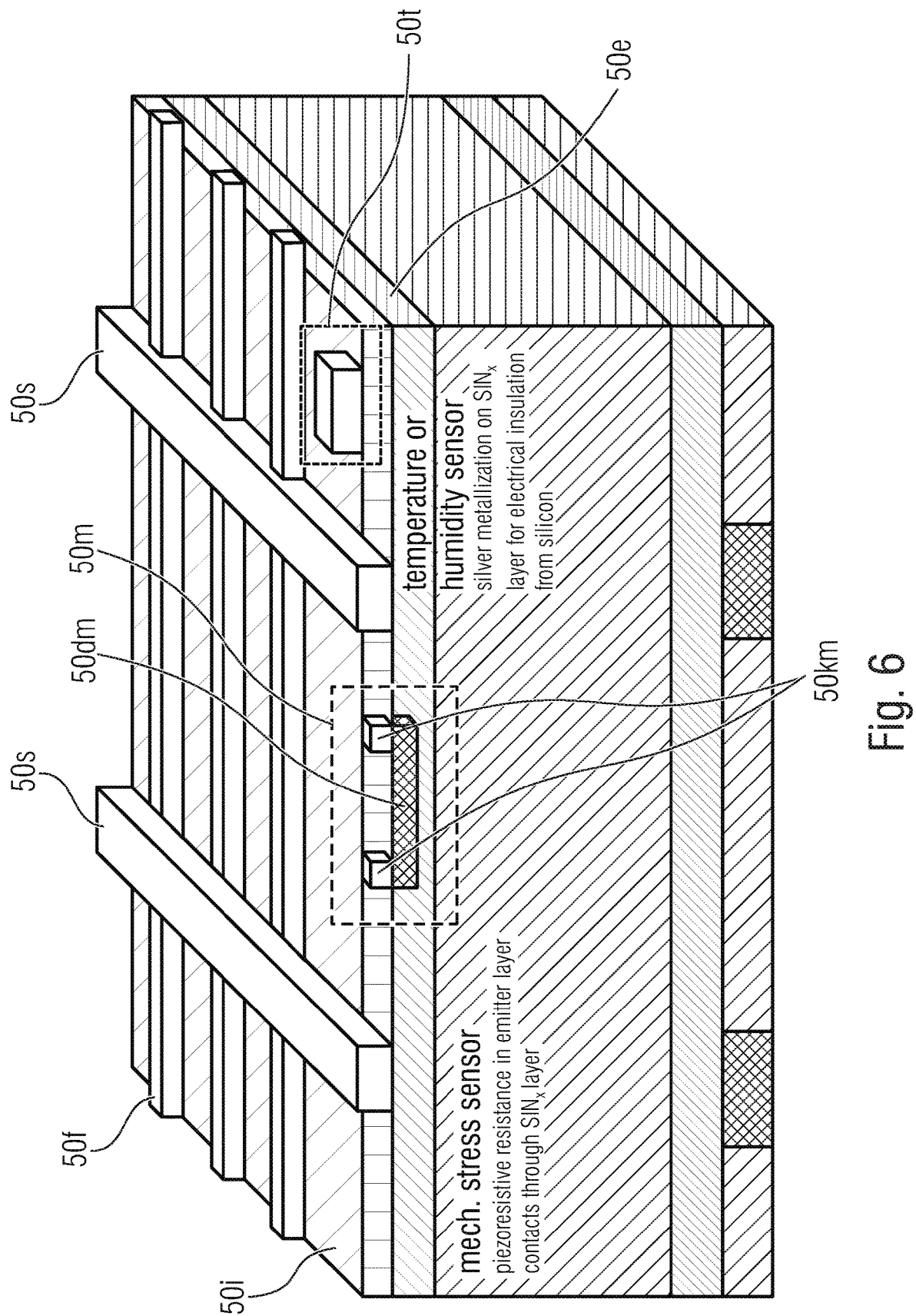

SOLAR CELL AND PHOTOVOLTAIC MODULE

CROSS-REFERENCE TO RELATED APPLICATIONS

This application is a continuation of copending International Application No. PCT/EP2019/060184, filed Apr. 18, 2019, which is incorporated herein by reference in its entirety, and additionally claims priority from German Application No. DE 102018206155.6, filed Apr. 20, 2018, which is incorporated herein by reference in its entirety.

BACKGROUND OF THE INVENTION

Embodiments of the present invention refer to a solar cell comprising a layer stack and to a photovoltaic module comprising solar cells. Further embodiments refer to a method of manufacturing the solar cell and a method of manufacturing the photovoltaic module. Advantageous embodiments refer to a solar cell and/or a photovoltaic module comprising integrated sensor technology.

Solar cells are the heart of a photovoltaic module (PV module). If they fail, the electrical output of the entire module is minimized. Failure of the solar cells may be caused by excessive mechanical stress or failure of the cell connectors, e.g. due to breakage of the cell connectors or corrosion due to moisture. Therefore, it is important to know the respective conditions of the solar cells at all times. Due to the laminate structure of a PV module, it is not possible to get to the solar cells after production. Furthermore, the materials used in the PV module have very different material properties, so that measurement, e.g. of the temperature next to the solar cells may only give a limited indication of the temperature of the solar cell itself due to inhomogeneous temperature fields. Therefore, independent, sensors not integrated in the solar cells are applicable to a certain extent only. Especially the mechanical stress of a solar cell cannot be measured in-situ as yet. Since the mechanical stress may lead to fractures in the solar cells and, thus, to (partial) failure, it is relevant to be aware of the mechanical stresses prevalent in the solar cells themselves. This is relevant for developing PV modules as the design may be more specifically adapted to the mechanical stress. During operation, operators will be enabled to recognize when a module has experienced critical stresses. As a result, the operators will be able to carry out specific inspections.

The temperature has an influence on the electrical performance of the solar cells. Therefore, it is of interest particularly in the development of PV modules to precisely know the temperature of the solar cells under certain influences. In addition, during operation of PV modules certain failure mechanisms such as delamination and hot spots caused by shaded, broken or electrically uncoordinated solar cells may be identified which are due to increased temperatures relative to neighboring PV modules or solar cells.

Moisture inside the PV module may, for example, lead to corrosion of the solar cells and cell connectors or to yellowing of the packaging (encapsulation). This minimizes the electrical performance of the PV module. Therefore, it is desirable to prematurely detect increased moisture inside the PV module in order to be able to take countermeasures.

Until now, no preventive measurements of mechanical stress, temperature or humidity have been carried out on PV modules once they have been installed. Up to now, only the consequences of excessive mechanical stress and humidity have been determined. In order to detect solar cell breakage, electroluminescence or infrared pictures, for example, have been used. In order to detect the reduction in electrical output, current-voltage characteristics are recorded. For this purpose, the PV modules have to be partially dismounted in order to be examined in a test laboratory. Even with increased humidity, so far only the consequences, such as formation of "hot spots", have been detected by infrared pictures.

In-situ measurement of physical quantities in PV modules currently has been based on commercially available autonomous sensors. As described above, capturing of the measured quantity therefore is quite imprecise. In addition, the use of commercially available autonomous sensors results in extra costs at the module level, both through the purchase of the sensors and through the extra effort of installation. Furthermore, due to its design, this type of sensors has a decisive influence on the geometrical setup of the very flat module itself and thus, also on the temperatures, stresses and humidity conditions at the measuring point. Therefore, such sensors are not used in PV modules that have already been installed.

For mechanical stresses, the following solutions are used according to conventional technology: for in-situ measurement of mechanical stress, strain gauges have been attached to the solar cell up to now. However, since said strain gauges in turn interact with the solar cell and the laminate, the actual stress state to be measured is changed. Furthermore, laboratory methods such as synchrotron X-ray microdiffraction [1, 2] and micro-Raman spectroscopy [3-5] are available. However, neither of these methods is suitable for in-situ measurements during operation or in usual degradation tests of the module.

According to conventional technology, the temperature may be determined as follows: commercially available temperature sensors such as measuring resistors or thermocouples are used. As already described above, these may only be placed next to or between the solar cells. Therefore, what is measured is the temperature of the packaging rather than that of the solar cell.

According to conventional technology, the following solutions are used for measuring humidity: in-situ humidity measurement is currently used only in development, in the form of commercially available humidity sensors. Since their geometry is not suitable for installation in PV modules, however, their use is usually limited to research purposes.

In order to be able to better monitor the environmental conditions during production or operation, there is a need for an improved approach.

SUMMARY

According to an embodiment, a solar cell may have a layer stack which may have at least the following features: a substrate; at least one doped region; at least one metallization structure; a sensor in the form of a strain gauge sensor, a capacitive humidity sensor or a temperature sensor; the sensor being integrated in a separate doped region or in separate metallization structures in the layer stack.

According to another embodiment, a photovoltaic module may have at least one solar cell which may have a layer stack which may have at least the following features: a substrate; at least one doped region; at least one metallization structure; a sensor in the form of a strain gauge sensor, a capacitive humidity sensor or a temperature sensor; the sensor being integrated in a separate doped region or in separate metallization structures in the layer stack.

Yet another embodiment may have a method of manufacturing a solar cell which may have a layer stack which may have at least the following features: a substrate; at least one doped region; at least one metallization structure; a sensor in the form of a strain gauge sensor, a capacitive humidity sensor or a temperature sensor; the sensor being integrated in a separate doped region or in separate metallization structures in the layer stack, which method may have the steps of: providing a substrate; forming a doped region in or on the substrate; and forming a metallization structure on the doped region; wherein a sensor is integrated into the layer stack during the forming of the doped region and/or of the metallization structure.

Embodiments of the present invention provide a solar cell comprising a layer stack. The layer stack has at least a substrate, a doped region and a metallization structure. One or more layers of the layer stack, i.e., for example, the metallization structure and/or the doped region, has/have a sensor such as a temperature sensor or a sensor for determining the mechanical stress integrated therein.

Embodiments of the present invention are based on finding that the layers of the layer stack which essentially make up the solar cell are suitable to be directly provided, in the manufacturing process, with regions or elements which together form a sensor. With this approach, temperature sensors (e.g. resistance thermometers in a metallization sheet) or sensors for determining the mechanical stress (=strain gauge sensors, sensors partly integrated into a doping layer or, generally, into the substrate and partly integrated into the metallization layer) may be implemented. Integration is cost effective because no production steps are necessary in addition to the steps already employed for solar cell processing, and it enables producing, as a result, a solar cell or, after additional steps, a photovoltaic module comprising sensors that may be read out during operation and/or also during production (e.g. during processing of the solar cell into a photovoltaic module).

Further embodiments provide a solar cell comprising a sensor forming a strain gauge sensor or a piezoresistive strain gauge sensor. According to the embodiments, the strain gauge sensor or the piezoresistive strain gauge sensor is formed by (local) doping within a layer stack plane of the layer stack. It is also conceivable here that even a lateral region of the solar cell itself is used, so that advantageously no solar cell area is strained. Advantageously, this strain gauge sensor or piezoresistive strain gauge sensor allows monitoring of deformations of the solar cell, e.g. during packaging of the photovoltaic module. A particular advantage is that the mechanical stress acting on the critical region, i.e. the substrate (rather than only a mechanical stress in one of the lamination sheets or an adjacent sheet), is accurately determined. According to embodiments, the resistance of the doped region in the substrate, which may be read out via external means, will change as a function of the prevailing mechanical stress, e.g. that is present in the substrate.

Further embodiments provide a solar cell comprising a temperature sensor as the sensor. According to the embodiments, the temperature sensor may be integrated into the metallization structure, the temperature sensor being formed, e.g., by one or more metallization paths within the plane of the metallization structure. This temperature sensor is easy and therefore inexpensive to manufacture and enables good monitoring of the solar cell temperature in a region relevant for the lifetime or operation (local region of the solar cell in contrast to a local region in another sheet (layer) of the photovoltaic module).

Another embodiment provides a solar cell comprising a humidity sensor as the sensor. According to the embodiments, this humidity sensor is formed by a capacitor, such as a comb capacitor, in combination with a moisture-sensitive material/polymer. The moisture-sensitive polymer has a dielectric constant that depends on the humidity of the air. As a result of a change in the dielectric constant, the capacity of the capacitor will change, so that the ambient humidity can be determined on the basis of this dielectric constant. According to embodiments, the moisture-sensitive polymer may be implemented by an encapsulation polymer (packaging polymer) in the form of an interconnecting layer to form a lamination sheet (see manufacturing of the photovoltaic module) or may be configured in the form of the lamination sheet of the photovoltaic module itself. Here, the polymer (encapsulation polymer) is placed on and especially between metallization paths of the capacitor or comb capacitor. According to embodiments, this capacitor is formed in the layer of the metallization structure or by the metallization structure itself. This is easily possible, for example, by placing two metallization paths laterally opposite each other in the layer of the metallization structure. By analogy with the other sensors, this sensor has the advantages that it may be manufactured at low cost and that the quantity to be measured is determined from a local point of view where the measured quantity is relevant for the solar cell, namely in the core of the multitude of sheets of a photovoltaic module.

According to embodiments, the sensors explained above or, in general, the sensors integrated into the solar cell may be supplied with energy by the solar cell itself. For this purpose, the sensor is connected to the energy generating structure of the solar cell, which is therefore configured to supply the sensor with power. This variation advantageously allows the sensor to work autonomously. According to further embodiments, the solar cell may also include a transmission unit configured to transmit the sensor signal, e.g. by radio or via the contacting paths which exist anyway. Here, thus, either the sensor signal is decoupled via a radio module additionally integrated into the solar cell or the PV module, or the sensor signal is modulated onto a power signal of the solar cell and/or the photovoltaic module. This variation further increases self-sufficiency of the sensors, so that no additional readout contacts are provided.

With regard to the layer stack, it should be noted at this point that the doped region may have the function of an emitter layer, for example. In this case, according to embodiments, the metallization structure is arranged on the doped region and forms the electrode. The doped region in turn is located on the substrate or is formed in the substrate. According to embodiments, the substrate also comprises a doping that differs from the doped emitter region. According to further embodiments, additional layers may also be formed, such as, on the opposite side, a further doped region and a further metallization structure. In addition, it would also be conceivable that the layer stack has an anti-reflection layer.

According to further embodiments, it would also be conceivable, especially with the humidity sensor and the temperature sensor, for an insulating layer to be provided, in the region of the metallization paths between the doped region and the metallization paths, which separates the metallization path from the doped region and/or from the substrate. The insulating layer may contain a silicon nitride and/or a silicon oxide, for example. These materials are also suitable for forming the anti-reflection layer described above.

Further embodiments provide a photovoltaic module comprising at least one solar cell as was already defined above.

A further embodiment provides a method of manufacturing a solar cell comprising the steps of
providing a substrate;
forming a doped region in or on the substrate; and
forming a metallization structure on the doped region.

The doped region and/or the metallization structure is/are formed such that also a sensor is integrated into the layer stack. According to further embodiments, the doping may be effected in such a way that a sensor, namely a strain gauge sensor or a piezoresistive strain gauge sensor, is also formed. According to yet further embodiments, the metallization structure is applied in such a way that the temperature sensor is formed. According to further embodiments, the step of forming the metallization structure is carried out such that a capacitor or comb capacitor is formed in the layer stack or within a plane of the layer stack (lateral capacitor); a polymer or an encapsulation polymer, which may be formed by a connecting layer of the lamination sheet of a photovoltaic module or a lamination sheet of the photovoltaic module itself, will then be introduced into the capacitor as a moisture-sensitive dielectric in order to form, in combination, a humidity sensor.

A further method is related to manufacturing a photovoltaic module, wherein the step of applying the encapsulation polymer or the bonding layer is performed accordingly.

According to a further embodiment, during the method of manufacturing the photovoltaic module, one of the manufactured sensors may be read out in order to advantageously monitor the environmental effects that are active during packaging.

BRIEF DESCRIPTION OF THE DRAWINGS

Embodiments of the present invention will be detailed subsequently referring to the appended drawings, in which:

FIG. 1 shows a schematic representation of a solar cell according to a basic embodiment;

FIG. 2a-2c show schematic representations and tables for illustrating an integrated stress sensor as a sensor according to embodiments;

FIG. 5a-5d show schematic representations of solar cells for illustrating individual features according to embodiments; and FIG. 6 shows a schematic representation of a solar cell comprising an integrated sensor according to extended embodiments.

DETAILED DESCRIPTION OF THE INVENTION

Figure 2A:
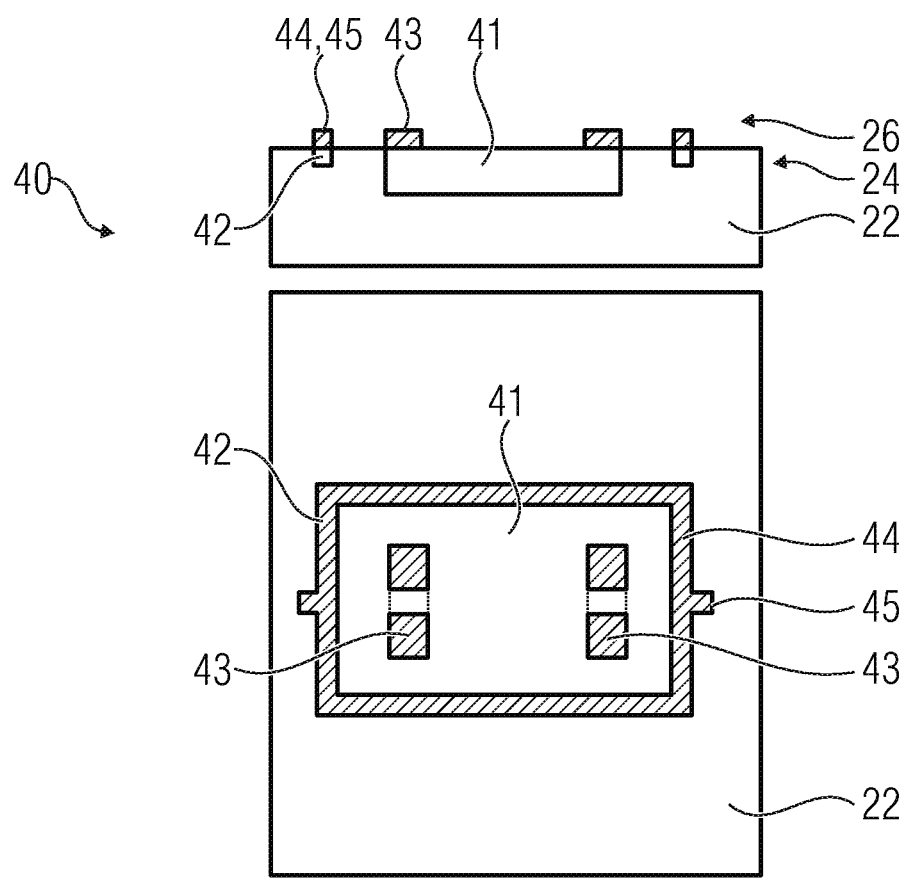

Before embodiments of the present invention will be explained below on the basis of the enclosed drawings, it should be noted that elements and structures having the same actions have been provided with the same reference numerals, so that their descriptions are mutually applicable and interchangeable.

Before explaining embodiments, the terms solar cell and photovoltaic module (PV module) will be briefly defined.

The expression solar cell refers to a component for photovoltaic energy conversion, i.e. a component that converts photons into electrons, which may be used as electrical energy. A solar cell may consist of different materials, e.g. monocrystalline, polycrystalline or amorphous silicon, a combination of elements from the $3^{rd}$ and $5^{th}$ groups of the periodic table, e.g. GaAs, InP, InGaP, so-called III-V solar cells, organic substances, perovskites or other thin-film materials such as CIGS, CIS and CdTe, as well as any combination of two or more of these materials, e.g. crystalline and amorphous silicon, crystalline silicon with perovskites, crystalline silicon with III-V solar cells or crystalline silicon with organic substances. A rectangular or square shape shall be assumed, but any other shape is also conceivable.

The term PV module is understood to mean any interconnection of any number of solar cells of any shape which are encapsulated with any material. For crystalline silicon solar cells, a series connection of at least one solar cell, which are connected to protective layers by encapsulation on the front and rear sides. Here, it is assumed that the front protective layer is a glass and the rear one is a film, but other layers are also conceivable, e.g. a pane of glass on the rear side, or a transparent polymer film on the front side.

FIG. 1 shows a solar cell 10 formed from a layer stack 20. The layer stack comprises the substrate 22, a doped region, which here is arranged as a kind of layer in the upper part of the substrate 22 and has been designated with the reference numeral 24. In addition, the layer stack also includes a metallization structure 26, which forms an electrode, for example, and is therefore arranged on the doped region 24. In addition, the layer stack may optionally have another doped region of the substrate opposite to the doped region 24, namely the doped region 24'. On this region 24', an additional electrode 26' is optionally provided.

As already explained above, the finding of the invention is based on that a sensor may easily be integrated into the layer stack 20 directly during production. Here, the sensor may be integrated, for example, in the doped region 24 or the metallization sheet 26. In this case, for example, it is assumed that the sensor provided with the reference numeral 30 is integrated in the metallization sheet 26. An example of a sensor that may be integrated into the metallization structure in such a manner is a temperature sensor. This temperature sensor may, for example, be formed by a conductive section that changes its resistance as a function of the prevailing temperature.

Alternatively or additionally, it would also be conceivable that the sensor, such as a mechanical stress sensor, is integrated into the layer 24, namely in the form of a piezoresistive element that changes a resistance value as a function of a prevailing deformation/mechanical stress. According to embodiments, such a sensor is also contacted with the metallization structures 26 also via the layer, but is essentially arranged in the doped region or is formed by doping.

Alternatively or additionally, it would be possible to provide a humidity sensor as the sensor. For example, said sensor may be formed as a capacitance (formed within the plane of the metallization structure 26) in combination with a moisture-sensitive polymer.

At this point it should be noted that according to embodiments it is not absolutely necessary to provide separate doped regions or separate metallization structures for the sensors, but that already existing metallization structures may also be used, e.g., for the contact as a temperature sensor element, or that a doped region that is present anyway for the formation of the solar cell is used as region for mechanical stress determination.

All sensor integrations explained above have in common that these become part of the solar cell 10 shown here. Common solar cell manufacturing methods are also used for producing the sensors. Therefore, the sensors are integrated into or applied to the solar cell 10 as early as during the solar cell manufacturing process. The measured variables may be measured directly in or on the solar cell. To supply the sensors with power, it would also be conceivable that the sensors are supplied with power from the current-generating region of the solar cell; with regard to signal decoupling, it should be noted that there are different variations here, e.g. wireless decoupling by radio, or decoupling via the already existing current-carrying structures.

With reference to FIG. 2a, a mechanical stress sensor for integration into the solar cell 10 will now be explained.

FIG. 2a shows a sectional view and a top view of a mechanical stress sensor provided with reference numeral 40. It is assumed that the mechanical stress sensor 40 is essentially integrated into the substrate 22 or into the doped region of the substrate 24, respectively, and that a contact is made via the plane of the metallization structures 26. The stress sensor essentially consists of a piezoresistive resistor, which is formed as a doped region 41. The resistor is contacted via the contacts 43. These contacts 43 are located within the plane of the metallization structures 26. According to embodiments, the metallization may be made of silver or any other conductive material such as aluminum. A ground ring 42 is provided around the piezoresistive resistor 41, which may also be formed by a region having high doping. This ground ring 42 is contacted via the contacts 45, which are electrically connected to a metallization of the ground ring 44. The metallization 44 extends along the entire ground ring 42, only not within the plane of the ground ring 24, but within the plane of the metallization 26.

The functionality of the mechanical stress sensor 40 will be explained below. The mechanical stress sensor 40 enables in-situ measurement of the mechanical stress in the solar cell within a PV module. This allows measuring the mechanical stress during the entire lifetime of a PV module. Among others, the following application areas are conceivable according to embodiments: during the module manufacturing process, during climate chamber testing, load tests, transport to the installation site or assembly and operation. In the implementation of the stress sensor, the piezoresistivity of silicon or any other semiconductor is used to measure the mechanical stress. For this purpose, a resistor 41 is introduced into the solar cell by sites of high local doping. This results in two possible design variations:
1. an n-doped resistor in a p-doped solar cell
2. a p-doped resistor in an n-doped solar cell,
    where the different types of doping of the solar cell refer especially to the doping of the substrate 22.

The same principle is applicable to both versions. From the changes in resistance, a voltage may be determined which allows a conclusion to be drawn about the mechanical stress/deformation prevailing in the substrate 22. The electrical contact is made, for example, via the (silver) metallizations 43 which are typically used in solar cells and to which a cable/stranded wire, for example, may be soldered (not shown). The sensor is shielded, i.e. insulated, from the rest of the solar cell by an optional ground ring 42 and 44 so that the sensor experiences a defined current/voltage. This is also implemented by local doping (see region 42) and by metallization structures 44 arranged on the local doping 42.

In each case, the dopant of the solar cell is used in a higher concentration. In this respect, doping 41 differs from doping 22 and doping 42.

The sensors may be implemented in two versions, namely as a single sensor or in the form of a Wheatstone bridge, i.e. by connecting four identical sensors. This variation has the advantage that temperature influence may be neglected.

Figure 2C:
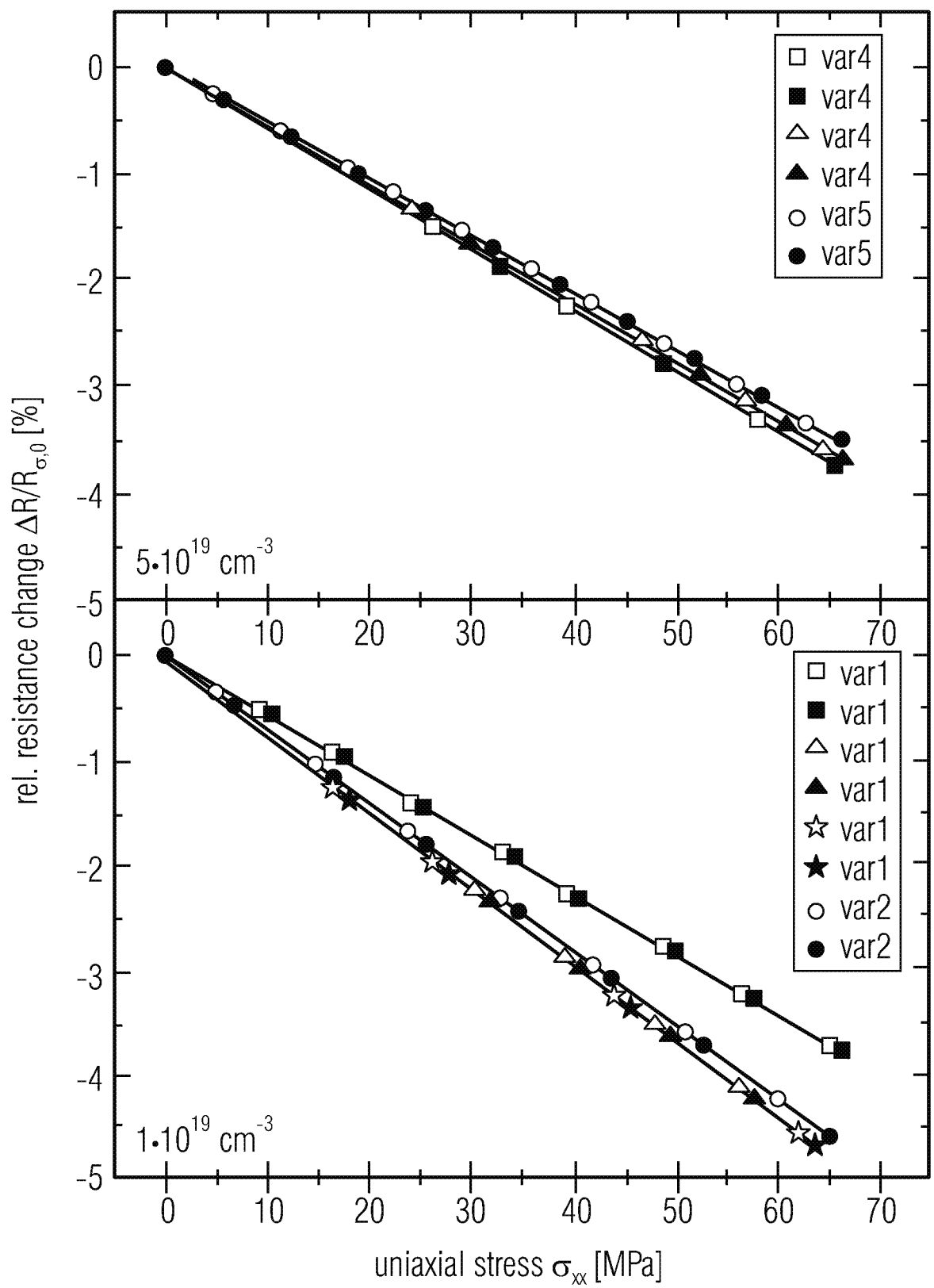

With reference to FIGS. 2b and 2c, the following details will be explained in accordance with embodiments.

Piezoresistive mechanical stress sensors are well known in the field of microelectronics [7-9]. We transfer the method to p-type silicon solar cells and restrict the technologies used to solar cell production technologies. More precisely, the mechanical stress sensor is implemented by a rectangular piezoresistive resistor using local n-doping by ion implantation and subsequent silver metallization.

The sensor resistance $R_{\sigma,0}$ depends on the sheet resistance $R_\square$, its length l and width w:

$$R_{\sigma,0} = R_\square \frac{l}{w} \tag{1}$$

If an external mechanical stress is applied to the sensor, the change in resistance $\Delta R_\sigma$ can be expressed by the piezoresistive tensor π[7], which also reflects the anisotropy of silicon. Tensors are printed in bold.

$$\Delta \vec{R}_\sigma = R_0(\pi \cdot \vec{\sigma}) \tag{2}$$

with $\vec{\sigma}$ being the mechanical stress vector in the so-called Voigt notation. For uniaxial mechanical stress, which is the case in a four-point bending test, the mechanical stress vector $\sigma_{xx}$ has just one component, and equation (2) is reduced to:

$$\Delta R_\sigma = R_{\sigma,0}(\pi_{11}\sigma_{xx}) \tag{3}$$

The piezoresistive factor $\pi_{11}$ depends on the temperature T and the carrier concentration N, which can best be described by the dimensionless P-factor P [10].

$$\pi_{11}(T,N) = \pi_{11,ref}P(T,N) \tag{4}$$

where $\pi_{11,ref}$ is the piezoresistive factor at room temperature and a given carrier concentration $N_{ref}$. With equations (1) and (4), the change in resistance $\Delta R_\sigma$ due to uniaxial mechanical stress becomes $$\Delta R_\sigma = R_\square \frac{l}{w}\pi_{11,ref}P(T,N)\sigma_{xx} \tag{5}$$

Hence the change in resistance $\Delta R_\sigma$ is influenced by the sheet resistance $R_\square$, the aspect ratio a=l/w, the charge carrier concentration N and the temperature T. The latter vanishes for sufficiently high charge carrier concentrations ($>10^{19}$ cm$^{-3}$) [10].

From the above equations, which cover different influences on the change in resistance $\Delta R_\sigma$, six different sensor design variations have been developed, for example.

The sheet resistance is kept constant at a target value of 100 Ω/sq. We examine three different aspect ratios a and two different charge carrier concentrations N. The table in FIG. 2b lists all design variations. Additionally, all variations are implemented in Wheatstone bridge configurations, but are not shown here. In order to prevent a parasitic current to/from the solar cell, the substrate around the sensor is grounded by a ground ring. This is implemented by a high local p$^+$ doping.

These variations, or the sensors, have been manufactured on industrial p-type solar wafers, for example. For characterization on a four-point bending bridge, the wafers are split into single stripes of 10×100 mm². Each stripe contains four different variations, of which for two, the current-voltage characteristics can be measured by a four-point probe.

In pretests, we found that the sensor stripes fracture at around 90 MPa, therefore the test range is limited to 65 MPa and subdivided into 13 load steps. At each load, the at an applied voltage of 1 V current is measured by a four-point probe. From this we calculate the change in resistance $\Delta R_\sigma$ relative to 0 MPa. Finally, the sensitivity S of the sensor is evaluated by the following equation:

$$S = \frac{\Delta R_\sigma}{R_{\sigma,0}\Delta\sigma_{xx}} \quad (6)$$

The preliminary results of the measured sensors from variations 1, 2, 5 and 6 are presented in FIG. 1. Variation 1 shows a sensitivity of (−0.067±0.008) %/MPa. The large error is mainly due to the deviation of two samples with a sensitivity of (−0.05657±0.00015) %/MPa (light and dark red). Without these two samples, the sensitivity is (−0.0729±0.0006) %/MPa. From the preliminary results, we assume the deviation is due to variabilities in the production process. As expected, the sensitivity of variation 2, (−0.0696±0.0004) %/MPa, is within the same range as that of variation 1. Variations 4 and 5, having a higher carrier concentration of 5·10¹⁹ cm⁻³, show lower sensitivities of (−0.0546±0.0011) %/MPa and (−0.0527±0.0003) %/MPa, respectively. These values, too, are within the same range. Since sensitivity is a relative value, the influence of the aspect ratio a theoretically vanishes. Practically, it seems to have a small influence, most likely due to deviations in the production process. However, this will have to be confirmed by the ongoing measurements.

These preliminary results for change in the relative resistance as a function of uniaxial mechanical stress are shown in FIG. 2c. The upper diagram assumes a charge carrier concentration of 5·10¹⁹ cm⁻³, while the lower variation assumes 1·10¹⁹ cm⁻³. Sensors having an aspect ratio of 10 are marked by squares, while sensors having an aspect ratio of 5 are marked by circles. The lines are a linear fit to each sensor.

As mentioned above, the wafer stripes fracture at around 90 MPa, which is a very low fracture stress. This is most likely due to the splitting process in which the wafer is sawn by a chip saw. This process generates many flaws in the silicon, which increase the probability of failure at low loads.

The results show that it is possible to integrate mechanical stress sensors into solar cell wafers. This enables in-situ stress measurement during the entire PV module production processes, during testing and during operation in the field.

In the following, a temperature sensor will be explained with reference to FIG. 3a. According to embodiments, the temperature sensor is modeled on a Pt100 sensor. As already explained above, the temperature sensor is advantageously introduced into the layer stack in such a way that it may directly measure the temperature of the solar cell. For this purpose, the cell metallization used in the photovoltaic cell is used as a resistor. The temperature is determined on the basis of the change in resistance. Implementation is effected, according to embodiments, by means of a meander-shaped resistor as shown in FIG. 3a.

Figure 3A:
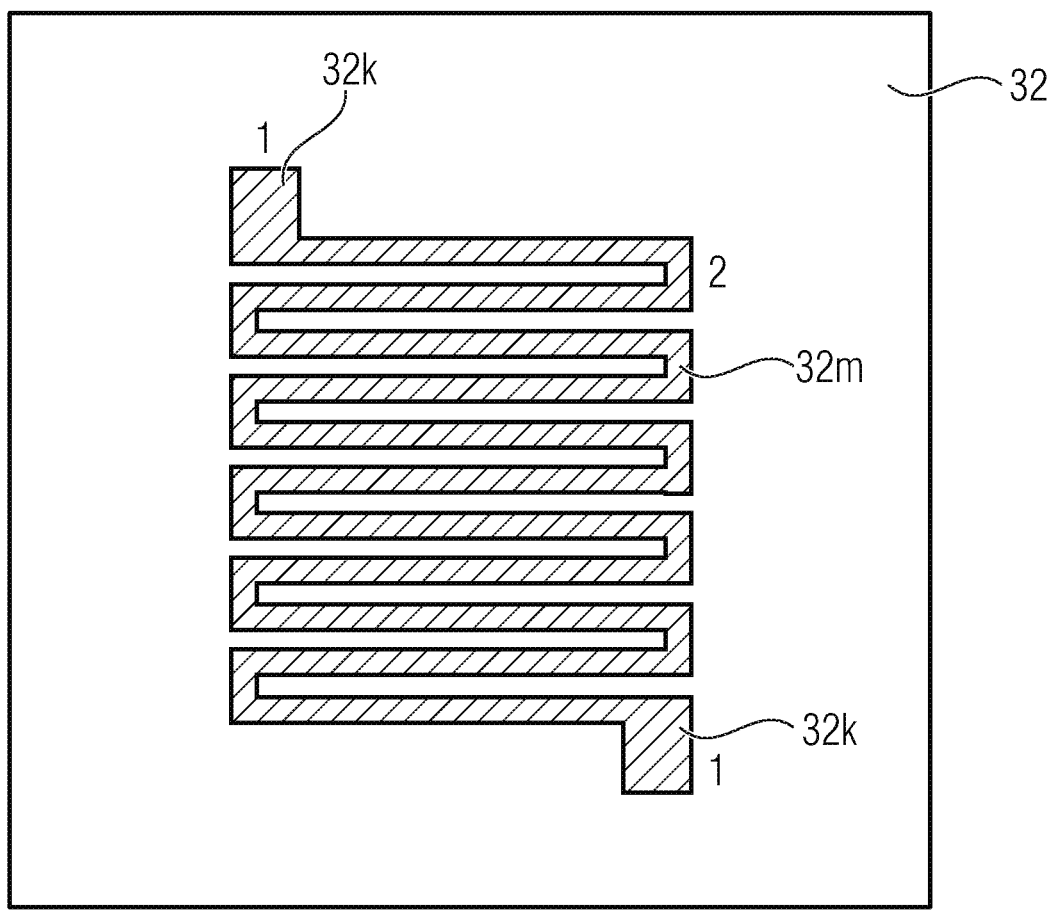
FIGS. 3a and b show schematic representations and diagrams for illustrating an integrated temperature sensor as a sensor.

FIG. 3a shows a temperature sensor 32, which has a meander-shaped section 32m. This meander-shaped section 32m connects the two contact points 32k with each other. Both the contact points 32k and the meander-shaped region 32m are arranged within one plane, namely within the plane of the metallization path, and are produced simultaneously with the metallization structures which are introduced anyway for solar cell production.

According to advantageous embodiments, the sensor is electrically insulated from the solar cell. This may be implemented as follows, for example.
1. use of a metallization which does not break through the SiO₂-layer
2. application of an additional insulating layer, e.g. insulating varnish For electrical contacting, there is a contact field 32k, which also consists of silver and which may have, e.g., a cable/stranded wire soldered onto it.

On the basis of the temperature sensitivity of the silver used for the metallization, a sensor was developed equivalent, for example, to a commercially available Pt sensor, such as a Pt100 sensor. Accordingly, the structure was designed such that the resistance $R_{T,0}$ at 0° C. corresponds to 100Ω. Depending on which Pt or Nt sensor is to be simulated, the resistance value may be selected differently. The resistance $R_{T,0}$ depends on the specific resistance ρ, the length l, the width w, and the height h:

$$R_{T,0} = \rho\frac{l}{hw} \quad (7)$$

The temperature dependence is expressed by the coefficient $\alpha_T$.

$$R_T(T) = R_{T,0}(1+\alpha_T T) \quad (8)$$

where $R_{T,0}$ and $\alpha_T$ are defined for the temperature 0° C.

Due to the relatively low specific resistance ρ of silver of 1.6·10⁻⁵ Ωmm [11], the length of the sensor has to be long according to equation (7) in order to achieve a resistance of 100Ω. Therefore we design the sensor in a meandering style. The sensor is produced in-house using physical vapor deposition, and is calibrated in a climate chamber. The change in resistance is measured by a four-point probe during three temperature cycles within the range of −40 . . . +160° C. The temperature is measured by an external Pt100 temperature sensor.

Figure 3B:
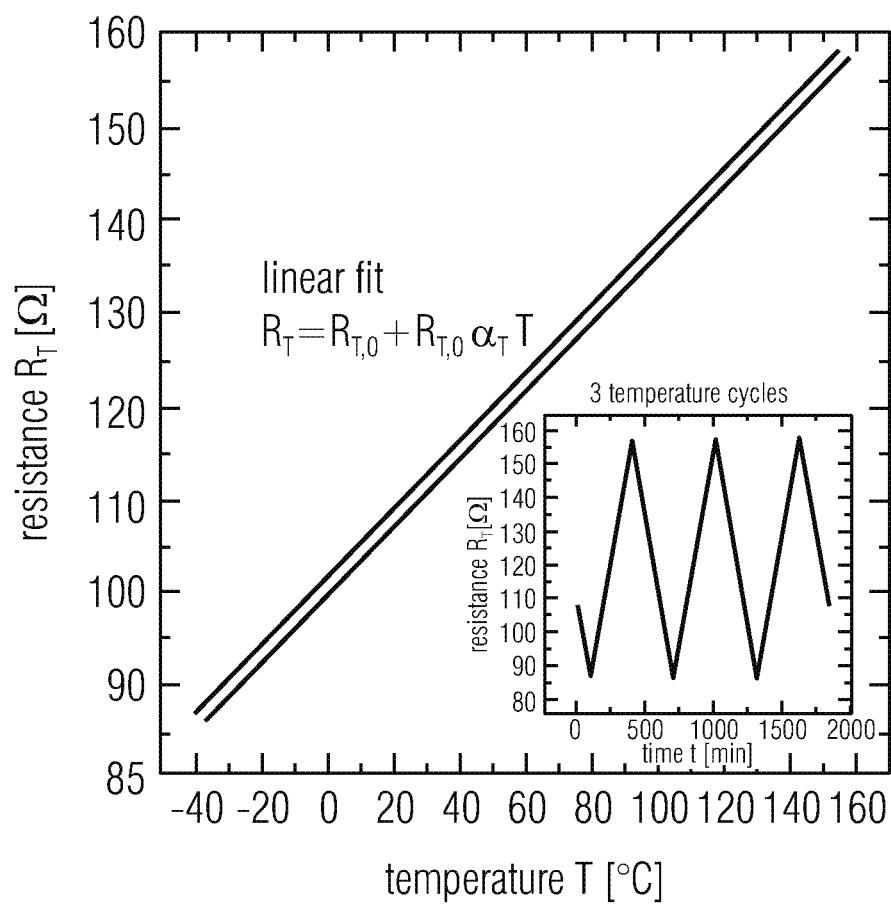

With reference to FIG. 3b, the preliminary results of four sensors will be explained. The variance is not significant, so that it will be sufficient to represent only one sensor in FIG. 3b.

FIG. 3b shows the temperature-dependent resistance $R_T$ of one exemplary temperature sensor. The data represents three temperature cycles shown in the insert, the lines corresponding to a linear fit.

From the linear fit $R_T = R_{T,0} + R_{T,0}\alpha_T T$ we obtain the resistance temperature coefficient $\alpha_T$ as the slope divided by $R_{T,0}$. The mean of all four sensors is 3.672±0.014 10⁻³K⁻¹.

The small variance of the characterized temperature sensors shows that the designed sensor is suitable to measure the temperature of a solar cell.

Figure 4A:
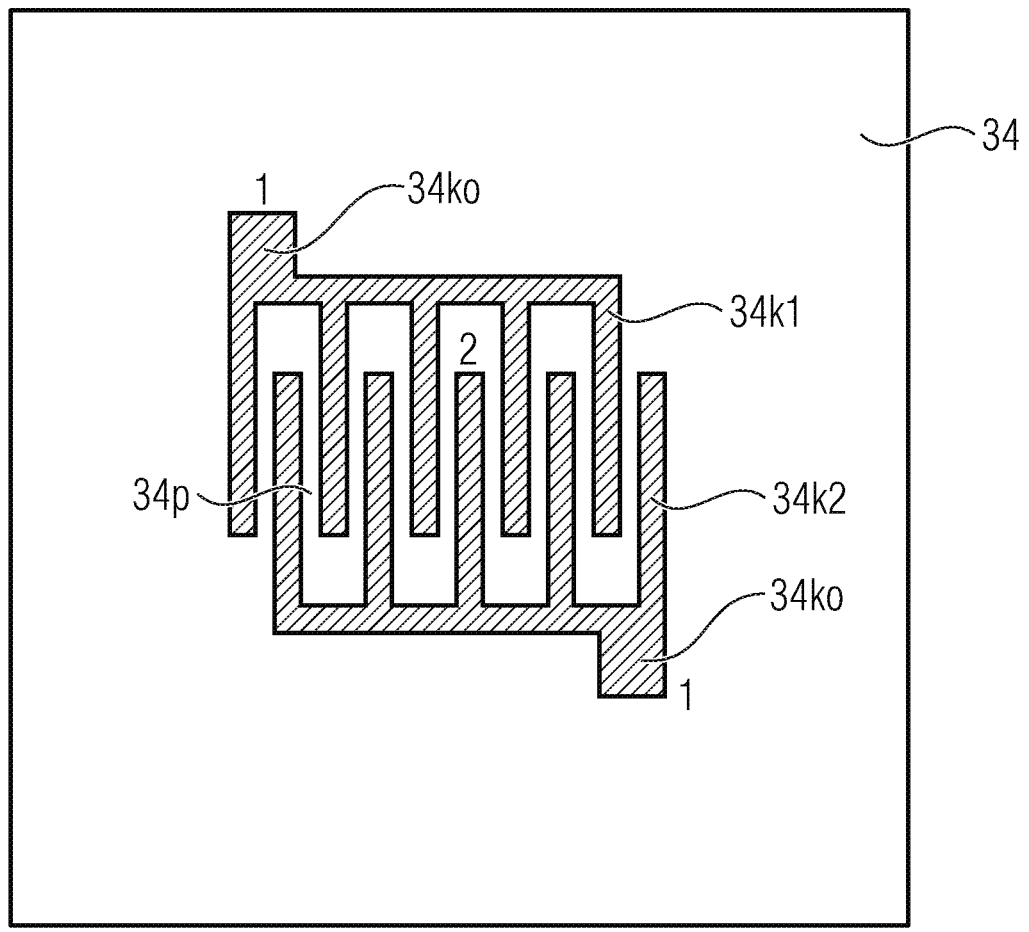
FIG. 4a shows a schematic representation of an integrated humidity sensor as a sensor.

With reference to FIG. 4a, a humidity sensor will be explained. The humidity sensor 34 may essentially be determined as a capacitor with a dielectric dependent on the humidity of the surrounding air. In this embodiment, the capacitor may be described as a comb capacitor having the two combs 34k1 and 34k2. The two combs 34k1 and 34k2 mesh with each other and are both formed within the plane of the metallization layer. Each of the capacitor combs 34k1 and 34k2 has a contact point 34ko. The moisture-sensitive dielectric 34p is provided between the combs 34k1 and 34k2. To return to the manufacturing process, the dielectric 34p is applied as a single polymer during the production of the solar cell or during completion of the photovoltaic module through an encapsulation or bonding layer. In this respect, the humidity sensor is configured to measure the humidity of the encapsulation.

The humidity sensor is to measure the humidity of the encapsulation. For this purpose, the dependence of the dielectric constant of the encapsulation polymers is exploited, the measurement being performed in a capacitive manner. For capacitive measurement, a capacitor is applied to the solar cell. The water content of the encapsulation may be determined from the change in capacitance. One possible design of the capacitor is a comb capacitor. The capacitor has to be electrically insulated from the solar cell. This results in the same design variations as for the temperature sensors.

1. use of a metallization which does not break through the $SiO_2$ layer.
2. application of an additional insulating layer, e.g. insulating varnish For electrical contacting, there is a contact field 34ko, which also consists of silver and which may have a cable/stranded wire soldered onto it.

Although the above explanations regarding the mechanical stress sensor, the temperature sensor and the humidity sensor have been explained by means of specific embodiments, it should be noted that it is known to the person skilled in the art that humidity, temperature or mechanical stress may also be measured on the basis of other physical phenomena. As the first example of this, the Seebeck effect may be mentioned which makes it possible to measure temperature when using two different materials. A second variation example is the use of capacitive structures for measuring mechanical stress. For this purpose, meander-shaped structures are used which vary in their distance as a function of a force applied, so that a mechanical stress may be determined on the basis thereof.

In the following, the basic structure of a solar cell or a photovoltaic module will be explained with reference to FIGS. 5a to 5d. FIG. 6 shows in detail where the sensors may be arranged.

Figure 5A:
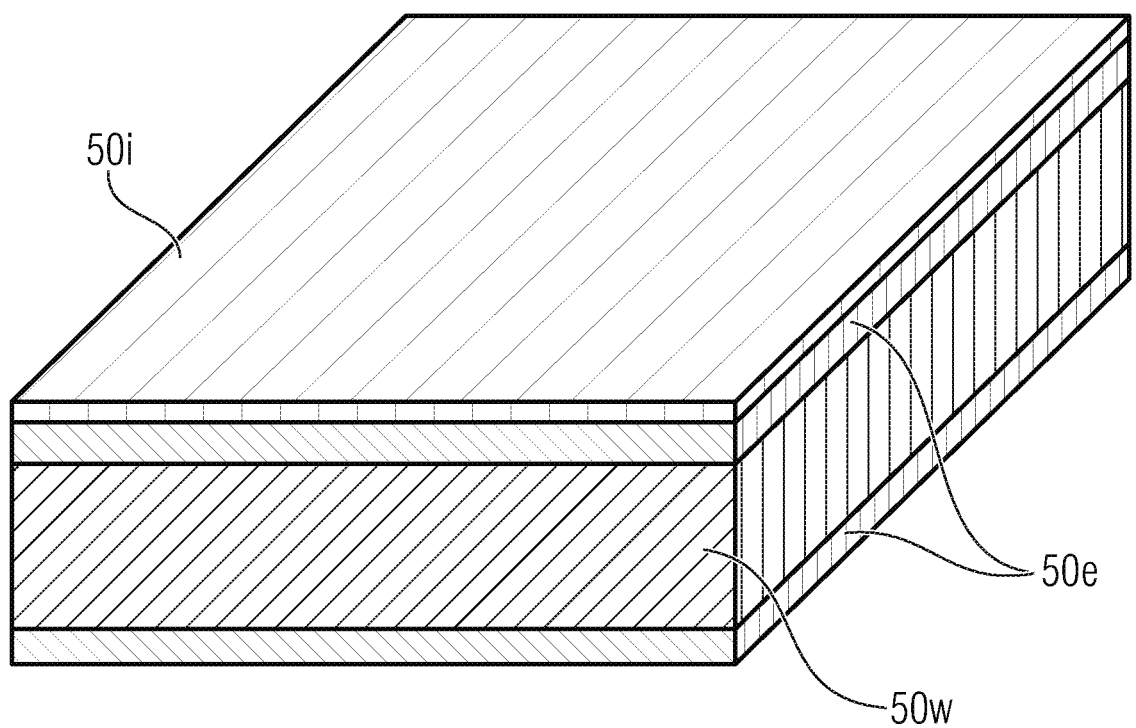

FIG. 5a shows an intermediate step in the production of a solar cell. Here we assume a p-type Si wafer 50w as the basis, on which n-type emitters 50e are applied through doped layers or doped regions. The p-type basic doping may be created by boron, for example, while n doping is achieved by phosphorus. Other dopants are also possible, of course.

The emitters 50e are provided on both the top and bottom sides, i.e. on both main surfaces. In this variant, an insulating layer 50i, e.g. a $SiN_x$ ARC layer, is deposited on one of the two emitter layers 50e. An electrode is then provided on this layer 50i, as shown with reference to FIG. 5b. This electrode may be designed like a grid, for example, which may be described by individual fingers 50f. These fingers are connected to each other by paths, e.g. via metallizations 50s (also called busbars). The contact on the opposite side may be implemented, for example, by a full-surface aluminum layer 50rc, in which contact pads (e.g. AgAl) 50c are embedded. The Al-BSF (back surface field, corresponding to a highly doped p+ zone), which is formed underneath the aluminum layer 50rc during solar cell processing, ensures a reduced recombination of the free charge carriers on the rear side of the cell and, thus, leads to increased efficiency of the solar cell. This step shown in FIG. 5b may be described as a solar cell consisting of the layer stack of layers 50f, 50e, 50w, 50c, 50rc. The layer 50e is to be equated with the doped layer or doped region, while the layer 50f matches the metallization structures. In this solar cell shown in FIG. 5b, or a multitude of such solar cells arranged to form a matrix, are then assembled into a photovoltaic module during lamination or encapsulation, as shown in FIG. 5c by way of example.

Figure 5B:
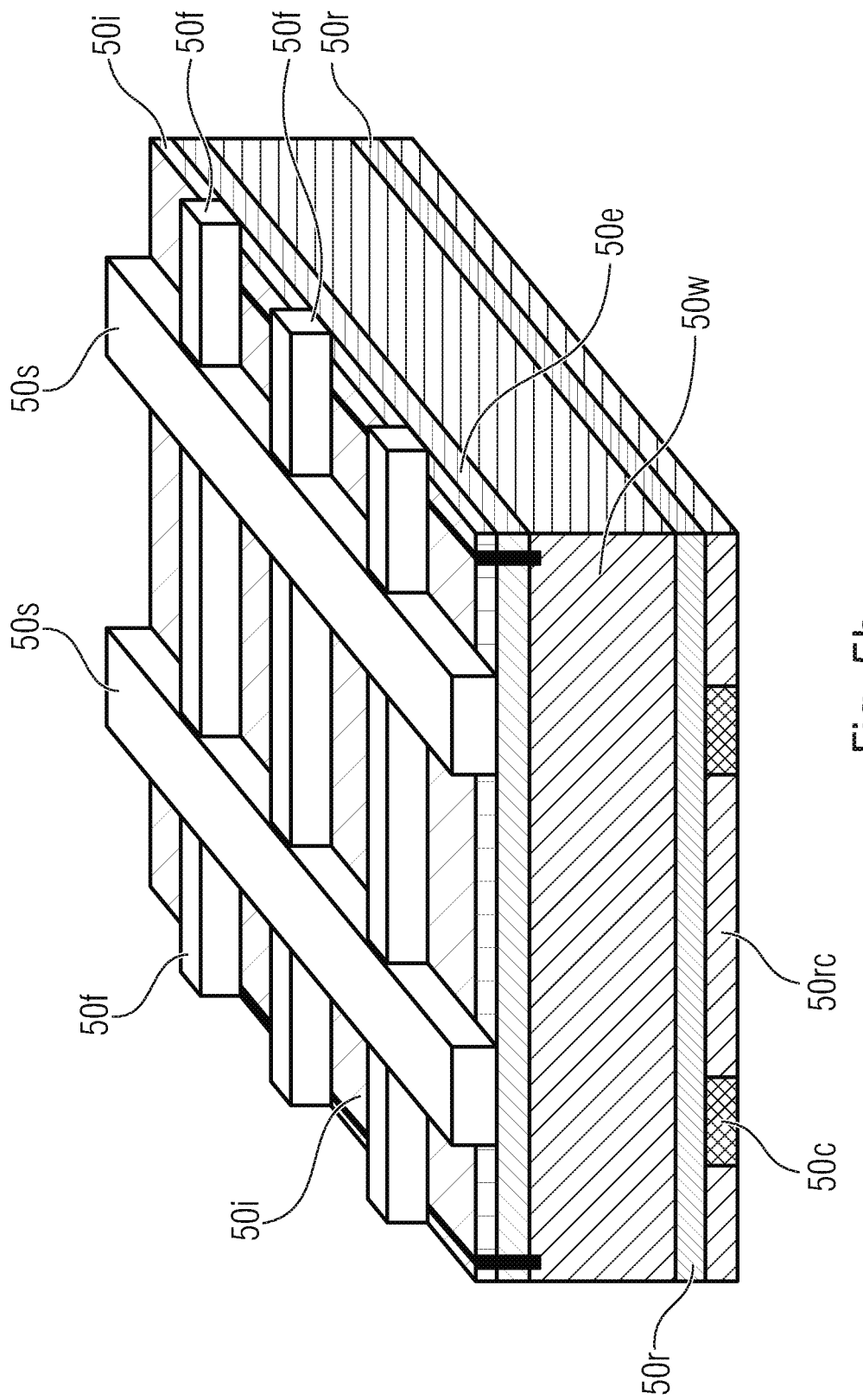
Figure 5C:
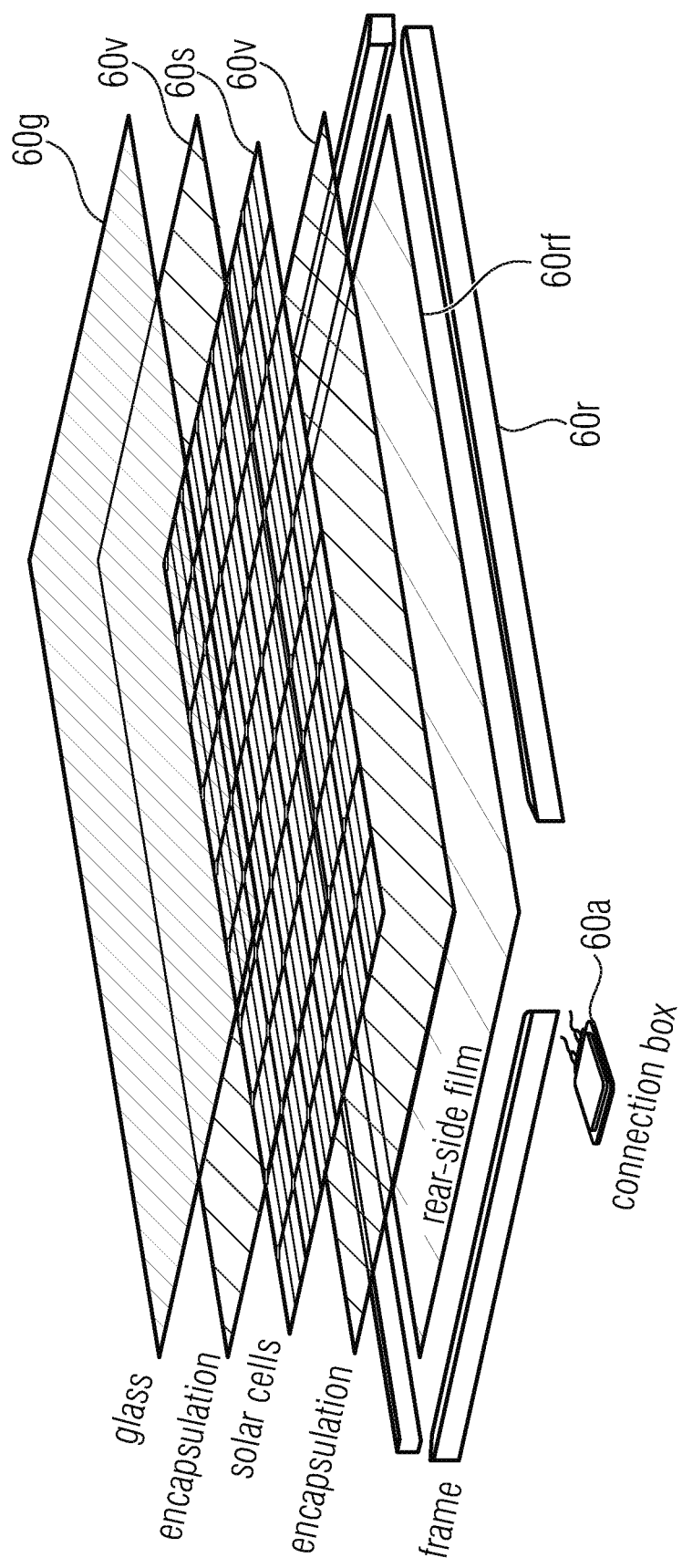

FIG. 5c shows a multitude of solar cells assembled by a matrix (e.g. 6×10 matrix), which are marked by reference numeral 60. This solar cell matrix 60s is laminated onto a pane of glass 60g, and an encapsulation layer 60v is used between the pane of glass 60g and the solar cell matrix 60s. This encapsulation layer has already been used in above embodiments in connection with the humidity sensor, since this encapsulation layer may form the humidity-sensitive polymer, for example.

After applying the solar cells 60s to the pane of glass 60g while using the encapsulation layer 60v, a further encapsulation layer 60v is applied so as to then finalize the photovoltaic module with the rear-side film 60rf. In addition, the module typically has a frame designated by reference numeral 60r. This frame may also include, for example, electrical contacting, in this case connection box 60a.

Regarding electrical contacting of the individual solar cells of the multitude of solar cells 60s arranged to form a matrix, please refer to FIG. 5d.

FIG. 5d shows the solar cells 60s, which are laminated to the front glass 60g by means of the encapsulation 60v and sealed by means of the rear-side film 60rf. The individual cells are connected to one another via electrically conductive connectors, such as silver connectors 60e. The cells may be interconnected by soldering (e.g. SnPb Ag coated Cu flat wires). This connection is usually made before or during the lamination process so that the contacts may be led to the outside to the frame 60r.

Even if the above structure is assumed to be based on a p-type wafer with n emitters, the solar cell may also be manufactured in reverse: basis of an n-type substrate and a p-type emitter.

Likewise, the metallization structures may vary, which are shown here as fingers connected by the paths. The contact on the rear side, which is typically implemented to be full-surface, may also be formed as a finger structure or a full-surface structure.

Of course, in addition to the layers shown, integration of further layers, such as additional anti-reflection layers or the like, is also conceivable.

Regarding the doped layer 50e, it should be noted that it is not a layer in the true sense of the word, but is produced by doping the substrate 50w.

On the basis of this structure, and especially of the structure shown in FIG. 5b, it would be conceivable to introduce sensors into the solar cell.

FIG. 6 shows the layer stack comprising the layers 50f, which are connected to each other via the conductor paths 50s and together form the metallization structure. This metallization structure is arranged on the insulating layer 50i, which in turn is located on the emitter 50e. The layer 50i serves for insulation, on the one hand, and for the improvement of the optical properties, namely as an anti-reflection layer, on the other hand.

In the layer of metallization, a temperature sensor 50t may be produced, as shown here. This temperature sensor 50t is insulated from the emitter 50e by the layer 50i. In addition, the temperature sensor 50*t* is also insulated from the metallization structure 50*f*+50*s* according to advantageous embodiments. However, according to embodiments shown, an electrical connection may also be provided, especially if the temperature sensor comprising an evaluation unit for the temperature sensor is supplied with power by the solar cell.

In addition to or instead of the temperature sensor 50*t*, a humidity sensor may also be formed in the same layer, namely in the layer of the metallization structures 50*f*+50*s*. Said humidity sensor is, as explained above, also formed by a metal structure, namely a capacitor (rather than a resistor, as compared to the temperature sensor), which additionally has a moisture-sensitive dielectric.

In addition to the temperature sensor 50*t* or humidity sensor, a mechanical stress sensor 50*m* is also illustrated. In the variant depicted, it extends over three layers, namely the doping layer/emitter layer 50*e*, in which a doped region 50*dm* of the mechanical stress sensor is arranged, the metallization layer 50*f*+50*s*, and the insulating layer 10*i*. This doped region may be contacted via contacts 50*km*, which are located in the layer of the metallization sheet 50*f*+50*s* and also pass through the insulating layer 50*i*. By analogy with the temperature sensor 50*t*, the mechanical stress sensor is also insulated from the metallization structure 50*f*+50*s*; of course, an electrical connection by means of a power supply unit may also be provided.

Solar cell-integrated sensors have the advantage that the measured variable is measured directly in or on the surface of the solar cell. Since implementation of the sensors may be integrated into the solar cell manufacturing process, there is the potential to integrate the above mentioned sensors on every solar cell and, thus, to achieve extremely low additional costs for the sensors, as compared to a solar cell comprising no sensor. This enables continuous monitoring of PV modules. This has the advantage that PV module operators may monitor the condition of each individual PV module by means of computer algorithms and need to carry out specific on-site checks in the case of critical values only. For example, if a module is measured to exhibit too much moisture, the PV module operator may inspect the PV module as a preventive measure and replace it if need be. The same applies to mechanical stress: if high/critical mechanical stress is or was measured in individual PV modules, the operator may check these PV modules specifically for solar cell fractures. If solar cell fractures are found, the operator also knows exactly when they occurred.

Possible technical fields of application are: silicon-based solar cells with integrated sensors, e.g.:
  mechanical stress
  temperature
  humidity
  PV modules with above solar cells for in-situ monitoring
    during operation
    manufacturing (interconnection, lamination)
    certification test according to IEC61215

Even if the above embodiments were based on temperature, humidity or mechanical stress sensors, integration of further (additional) sensors, such as irradiation sensors, may be provided according to further embodiments. The background to this is that since solar cells are manufactured on the basis of conventional silicon technologies and since different sensors are known that may be manufactured on a semiconductor basis, integration of such sensors into the layer stack of a solar cell should be clear, on the basis of the above teaching, to a person skilled in the art.

Even if above embodiments were explained especially in connection with a device, it should be noted that further embodiments refer to the corresponding manufacturing methods.

According to one embodiment, a manufacturing method of manufacturing a solar cell which comprises the steps of integrating the sensors is provided. Here, doping of the doped regions and/or application of the metallization structures is carried out such that the corresponding desired sensors are produced at the same time.

Another embodiment relates to a method of manufacturing a photovoltaic module, which also includes, for example, the lamination and/or contacting steps. By means of this manufacturing method, high temperatures occur, e.g. 150° C. for 8 minutes during lamination or 200° C. for 2 minutes during soldering of the individual solar cells, which are selected in such a way that the semiconductor structure of the solar cell or the layer stack generally is not damaged. In order to be able to monitor the process sufficiently well here, the temperature sensor which has already been integrated may be used to advantage, so that the manufacturing method of the photovoltaic module now also includes monitoring of process parameters that may be determined by means of the sensors. In addition to the temperature during the laminating and/or soldering steps, the mechanical stress, e.g. during lamination, may also be determined to advantage, of course. A further important process parameter is the humidity, which thus may be advantageously monitored as well.

Even if above embodiments were based on a device, it should be noted that the description of a device feature or a structure is also to be considered as a corresponding description of a corresponding method step.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

[1] V. A. Handara et al., "Probing stress and fracture mechanism in encapsulated thin silicon solar cells by synchrotron X-ray microdiffraction," *Solar Energy Materials and Solar Cells*, vo. 162, pp. 30-40, 2017.

[2] S. K. Tippabhotla et al., "Synchrotron X-ray Microdiffraction—Probing Stress State in Encapsulated Thin Silicon Solar Cells," *International Conference on Materials for Advanced Technologies (ICMAT2015), Symposium C—Solar PV (Photovoltaics) Materials, Manufacturing and Reliability*, vol. 139, pp. 123-133, 2016.

[3] W. Mühleisen et al., "Stress Measurements in Interconnected Solar Cells with Raman Spectroscopy", in *Proceedings of the 31st European Photovoltaic Solar Energy Conference and Exhibition*, Hamburg, Germany, 2015, pp. 160-163.

[4] A. Büchler et al., "Enabling stress determination on alkaline textured silicon using Raman spectroscopy", *Energy Procedia*, vol. 124, pp. 18-23, 2017.

[5] A. J. Beinert et al., "Thermomechanical stress analysis of PV module production processes by Raman spectroscopy and FEM simulation", *Energy Procedia*, vol. 124, pp. 464-469, 2017.

[6] M. Jankovec et al., "In-Situ Monitoring of Moisture Ingress in PV Modules Using Digital Humidity Sensors", *IEEE J. Photovoltaics*, vol. 6, no. 5, pp. 1152-1159, 2016.

[7] J. C. Suhling and R. C. Jaeger, "Silicon piezoresistive stress sensors and their application in electronic packaging", *Sensors Journal, IEEE*, vol. 1, no. 1, pp. 14-30, 2001.

[8] P. Gieschke, B. Sbierski, and O. Paul, "CMOS-based piezo-FET stress sensors in Wheatstone bridge configuration", in 2011 *IEEE Sensors*, Limerick, Ireland, pp. 93-96.

[9] P. Gieschke and O. Paul, "CMOS-integrated Sensor chip for in-plane and out-of-plane shear stress", Procedia Engineering, vol. 5, pp. 1364-1367, http://www.sciencedirekt-.com/science/article/pii/S187770581000915X, 2010.

[10] Y. Kanda, "Piezoresistance effect of silicon", *Sensors and Actuators A*, vol. 28, pp. 83-91, 1991.

[11] J. R. Rumble, *CRC handbook of chemistry and physics*, $98^{th}$ ed. Boca Raton, Florida: CRC Press, 2017.

The invention claimed is:

1. A photovoltaic module comprising at least one solar cell comprising a layer stack comprising at least the following features:
    a substrate;
    at least one doped region comprising an emitter layer within the substrate;
    at least one metallization structure;
    a sensor in the form of a strain gauge sensor;
    the sensor being integrated or partially integrated in the emitter layer of the at least one doped region in the layer stack;
    wherein the at least one solar cell is encapsulated with any material or laminated within any material.

2. The photovoltaic module as claimed in claim 1, wherein the strain gauge sensor comprises a piezoresistive strain gauge sensor.

3. The photovoltaic module as claimed in claim 2, wherein the strain gauge sensor or the piezoresistive strain gauge sensor is integrated by doping within the emitter layer of the layer stack.

4. The photovoltaic module as claimed in claim 2, wherein the strain gauge sensor or the piezoresistive strain gauge sensor exhibits a resistance which is set as a function of prevailing mechanical stress in the substrate.

5. The photovoltaic module as claimed in claim 1, further comprising a capacitive humidity sensor or a temperature sensor; or further comprising a capacitive humidity sensor or a temperature sensor being integrated or partially integrated in the at least one doped region or in the at least one metallization structure in the layer stack.

6. The photovoltaic module as claimed in claim 5, wherein the temperature sensor is integrated within a layer stack plane of the at least one metallization structure of the layer stack; and/or wherein the temperature sensor is formed by one or more metallization paths.

7. The photovoltaic module as claimed in claim 5, wherein the capacitive humidity sensor comprises a capacitor or comb capacitor and a polymer exhibiting a dielectric constant that depends on the humidity of the air.

8. The photovoltaic module as claimed in claim 7, wherein the capacitor or comb capacitor is integrated within a layer stack plane of the at least one metallization structure of the layer stack; and/or wherein the capacitor or comb capacitor is formed by one or more metallization paths.

9. The photovoltaic module as claimed in claim 7, wherein the polymer is formed by an encapsulation polymer in a form of a bonding layer to a lamination sheet of the photovoltaic module or from a lamination sheet of the photovoltaic module; and/or wherein the polymer extends on and/or between metallization paths of the capacitor or comb capacitor.

10. The photovoltaic module as claimed in claim 7, wherein the capacitor or comb capacitor of the capacitive humidity sensor or the temperature sensor or one or more metallization paths of the capacitive humidity sensor or one or more metallization paths of the temperature sensor are separated from the at least one doped region and/or the substrate by an insulating layer.

11. The photovoltaic module as claimed in claim 1, wherein the sensor is electrically connected to an energy generating structure of the solar cell, and the energy generating structure is adapted to supply the sensor with power.

12. The photovoltaic module as claimed in claim 1, the solar cell comprising a transmission unit which is configured to transmit a sensor signal of the sensor by radio or which is configured to superimpose the sensor signal on a power signal of the solar cell and/or of the photovoltaic module.

13. The photovoltaic module as claimed in claim 1, wherein wherein the at least one metallization structure is applied to the at least one doped region to form an electrode of the solar cell; and/or wherein the substrate is doped and the doping is different from the doping of the at least one doped region.

14. The photovoltaic module as claimed in claim 1, wherein the layer stack comprises a doped region of the at least one doped region on both sides of the substrate; and/or wherein the layer stack comprises a metallization structure of the at least one metallization structure on both sides of the substrate; and/or wherein the layer stack comprises an anti-reflection layer.

15. A method of manufacturing a solar cell comprising a layer stack comprising at least the following features:
    a substrate;
    at least one doped region comprising an emitter layer within the substrate;
    at least one metallization structure;
    a sensor in the form of a strain gauge sensor;
    the sensor being integrated in the emitter layer in the layer stack, said method comprising:
    providing the substrate;
    forming the at least one doped region in or on the substrate comprising forming an emitter layer in the substrate; and
    forming the at least one metallization structure on the at least one doped region;
    wherein a sensor is integrated into the emitter layer of the layer stack during the forming of the at least one doped region.

16. The method as claimed in claim 15, wherein the forming of the at least one doped region comprises doping the substrate to form a strain gauge sensor or a piezoresistive strain gauge sensor, and/or
    wherein forming the at least one metallization structure comprises forming a temperature sensor within a layer stack plane of the at least one metallization structure; and/or
    wherein forming the at least one metallization structure comprises forming a capacitor or comb capacitor within a layer stack plane of the at least one metallization structure, which the capacitor or comb capacitor forms a humidity sensor together with a polymer or an encapsulation polymer formed into a lamination sheet of the photovoltaic module or a lamination sheet of the photovoltaic module by a bonding layer.

17. The method of manufacturing a photovoltaic module as claimed in claim 16, comprising reading out the sensor during manufacture.

18. The method of manufacturing a photovoltaic module as claimed in claim 16, comprising applying a bonding layer or an encapsulation polymer to the at least one metallization structure so that the encapsulation polymer or the bonding layer forms a humidity sensor within a layer stack plane of the at least one metallization structure together with a capacitor or comb capacitor.

* * * * *